(12) United States Patent
Chen et al.

(10) Patent No.: US 11,093,669 B2
(45) Date of Patent: Aug. 17, 2021

(54) METHOD AND SYSTEM FOR QUANTUM COMPUTING

(71) Applicant: Alibaba Group Holding Limited, Grand Cayman (KY)

(72) Inventors: Jianxin Chen, Hangzhou (CN); Fang Zhang, Hangzhou (CN); Yaoyun Shi, Hangzhou (CN); Jiachen Huang, Hangzhou (CN); Michael Newman, Sunnyvale, CA (US)

(73) Assignee: Alibaba Group Holding Limited, George Town (KY)

( * ) Notice: Subject to any disclaimer, the term of this patent is extended or adjusted under 35 U.S.C. 154(b) by 182 days.

(21) Appl. No.: 16/387,408

(22) Filed: Apr. 17, 2019

(65) Prior Publication Data

US 2019/0332731 A1   Oct. 31, 2019

(30) Foreign Application Priority Data

Apr. 27, 2018  (CN) .......................... 201810398402.X

(51) Int. Cl.
*G06F 30/20* (2020.01)
*G06F 17/16* (2006.01)
*G06N 10/00* (2019.01)

(52) U.S. Cl.
CPC .............. *G06F 30/20* (2020.01); *G06F 17/16* (2013.01); *G06N 10/00* (2019.01)

(58) Field of Classification Search
CPC ................................ G06F 30/20; G06N 10/00
See application file for complete search history.

(56) References Cited

U.S. PATENT DOCUMENTS

2004/0024750 A1   2/2004   Ulyanov

OTHER PUBLICATIONS

Boixo, S. et al. "Simulation of low-depth quantum circuits as complex undirected graphical models". Jan. 2018 , [online], [retrieved on Aug. 28, 2019]. https://arxiv.org/pdf/1712.05384.pdf.

*Primary Examiner* — Matthew L Reames
(74) *Attorney, Agent, or Firm* — Shun Yao; Park, Vaughan, Fleming & Dowler LLP

(57) ABSTRACT

One embodiment described herein provides a system and method for simulating behavior of a quantum circuit that includes a plurality of quantum gates. During operation, the system receives information that represents the quantum circuit and constructs an undirected graph corresponding to the quantum circuit. A respective vertex within the undirected graph corresponds to a distinct variable in a Feynman path integral used for computing amplitude of the quantum circuit, and a respective edge corresponds to one or more quantum gates. The system identifies a vertex within the undirected graph that is coupled to at least two two-qubit quantum gates; simplifies the undirected graph by removing the identified vertex, thereby effectively removing the two-qubit quantum gates coupled to the identified vertex; and evaluates the simplified undirected graph, thereby facilitating simulation of the behavior of the quantum circuit.

17 Claims, 8 Drawing Sheets

METHOD AND SYSTEM FOR QUANTUM COMPUTING

RELATED APPLICATION

Under 35 U.S.C. § 119, this application claims the benefit and right of priority of Chinese Patent Application No. 201810398402.X, filed on Apr. 27, 2018.

BACKGROUND

Field

This disclosure is generally related to quantum computing. More specifically, this disclosure is related to a system and method for performing distributed simulation of a quantum circuit.

Related Art

In recent years, research efforts in quantum computing have made significant progress. Quantum computing refers to the computing based on quantum mechanical principles, such as superposition and entanglement. Large-scale quantum computers can theoretically solve certain problems much more quickly than any classical computers that use the best currently known algorithms. Those problems can include the integer factorization problem and the database search problem, where there is no searchable structure in the collection of all possible answers. Moreover, quantum computers may potentially be able to solve problems that are not practically feasible to be solved by classical computers.

Unlike common digital computing that requires data being encoded into binary digits, each of which is always in one of two defined states (0 or 1), quantum computing uses quantum bits (or qubits), which can be in superpositions of states. A qubit can be a two-state (or two-level) quantum mechanical system, such as the spin of electrons or the polarization state of photons. For example, the spin up state can represent "1," whereas the spin down state can represent "0." A spin that is neither up nor down can represent a superposition state. A small number of qubits can hold a relatively large amount of information. For example, the superposition states of 100 particles can represent up to $2^{100}$ numbers. A quantum computer can operate on its qubits using ultrafast laser pulses or other similar techniques.

Continuous hardware development of quantum computers has increased the number of controlled qubits from 9 or 10 to 50 or 72. Although such systems are still prototypes, it is important to verify whether large-scale quantum computers (e.g., a quantum computer having more than 50 qubits and over 30 layers) are behaving as predicted. For example, without accurate simulation of a quantum circuit, one cannot tell the difference between the actual output of a noisy quantum circuit and the output of an ideal noiseless quantum circuit, thus making it impossible to determine the efficiency of the circuit. More specifically, for a quantum circuit C operating over N qubits, assuming its input is $|00K\ 0\rangle$, one needs to know $\langle i_1, i_2, K, i_n | C | 00K\ 0 \rangle$, where $|i_1, i_2, K, i_n\rangle$ is an arbitrary quantum string. Classical simulations of quantum systems have been shown to be a valuable tool in the regime of noisy intermediate-scale quantum (NISQ).

Quantum supremacy or quantum advantage refers to the potential of quantum computing devices to solve problems that classical computers practically cannot. In 2017, Google announced plans to demonstrate quantum supremacy by solving the problem of sampling the output distribution of random quantum circuits. Google later announced a project that would analyze results from quantum circuits run on Google quantum processors. Theoretical works suggested that quantum supremacy can be possible with a two-dimensional lattice of 7×7 qubits and around 40 clock cycles. Later works have pushed the boundaries of what classical simulations can handle to up to 50 qubits.

However, still lacking is an effective solution for simulating large-scale quantum circuits. The main obstacle is that when the number of qubits reaches to 50, the dimension of the state space can be up to $2^{50}$, requiring the memory space of up to 16 PB, where 1 PB=1024 TB. Such a memory requirement is beyond even the most advanced supercomputers. If only a portion of the states is stored, then the circuit computation will continue to request information that is not stored, incurring a large amount of communication overhead.

SUMMARY

One embodiment described herein provides a system and method for simulating behavior of a quantum circuit that includes a plurality of quantum gates. During operation, the system receives information that represents the quantum circuit and constructs an undirected graph corresponding to the quantum circuit. A respective vertex within the undirected graph corresponds to a distinct variable in a Feynman path integral used for computing amplitude of the quantum circuit, and a respective edge corresponds to one or more quantum gates. The system identifies a vertex within the undirected graph that is coupled to at least two two-qubit quantum gates; simplifies the undirected graph by removing the identified vertex, thereby effectively removing the two-qubit quantum gates coupled to the identified vertex; and evaluates the simplified undirected graph, thereby facilitating simulation of the behavior of the quantum circuit.

In a variation on this embodiment, identifying the vertex comprises traversing all vertices in the undirected graph.

In a variation on this embodiment, identifying the vertex comprises performing a greedy algorithm based on an objective function associated with an execution time for evaluating the simplified undirected graph.

In a further variation, the system computes an initial tensor-contraction ordering using a treewidth computing algorithm.

In a further variation, performing the greedy algorithm comprises selecting a local range based on the initial tensor-contraction ordering and selecting an optimal vertex for removal within the local range in such a way that removing the optimal vertex results in a minimum time cost associated with evaluating the undirected graph.

In a variation on this embodiment, identifying the vertex comprises performing a dynamic programming algorithm.

In a variation on this embodiment, the two-qubit quantum gates comprise a two-qubit diagonal quantum gate.

In a further variation, the two-qubit diagonal quantum gate comprises a controlled-Z (CZ) gate.

In a variation on this embodiment, the quantum circuit has at least 50 qubits and a depth of at least 30.

BRIEF DESCRIPTION OF THE FIGURES

In the figures, like reference numerals refer to the same figure elements.

DETAILED DESCRIPTION

Figure 1:
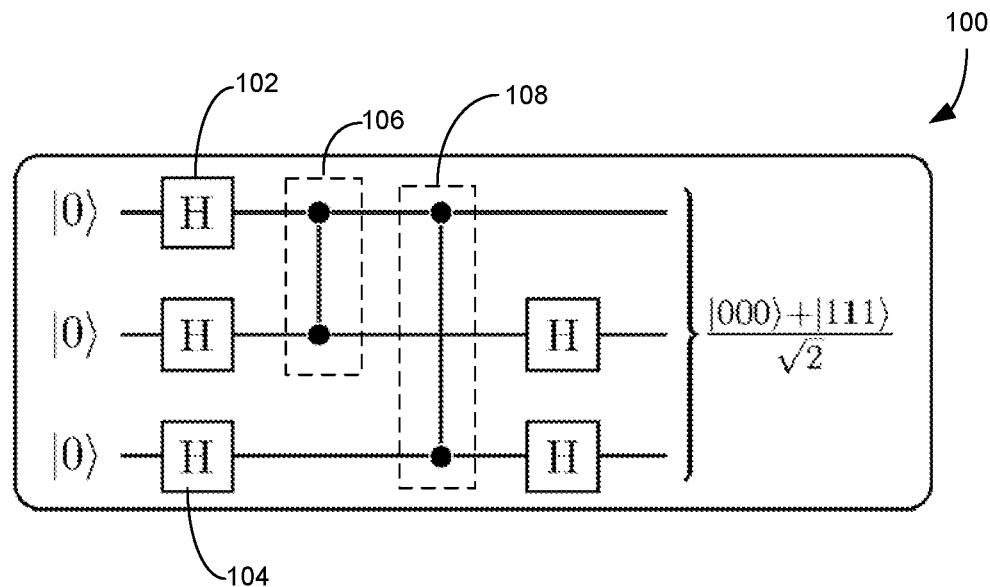
FIG. 1 illustrates the quantum circuit for generating the three-qubit Greenberger, Horne, and Zeilinger (GHZ) states.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a method and system for efficient simulation of a quantum circuit. More specifically, the simulation system uses the tensor network contraction approach and models the quantum circuit using an undirected graph. During operation, the simulating system examines the undirected graph to identify a vertex coupling to two controlled-Z (CZ) gates. By eliminating the vertex, the simulation system can simultaneously eliminate two CZ gates, thus significantly reducing the time- and space-complexity of the undirected graph.

Undirected Graphical Model

There are two approaches for simulating quantum circuits. One approach is based on matrix multiplication and one approach is based on tensor network contraction. The matrix-multiplication approach can be processed in parallel on super computers but with limited space-complexity, and the tensor-network-contraction approach encounters difficulties in parallel processing. To enhance the simulation efficiency, in some embodiments, the simulation system uses the tensor-network-contraction approach that is processed in parallel. More specifically, the simulation system models a quantum circuit using an undirected graphical model. Note that an undirected graph or an undirected network refers to a set of objects (called vertices or nodes) that are connected together, where all edges are bidirectional.

A quantum circuit can be used to model quantum computations using quantum gates, which are reversible transformations on a quantum mechanical analog of an n-bit register. This analogous structure can also be referred to as an n-qubit register or a quantum register. In a quantum circuit, the quantum registers store initial quantum states. In typical implementations, the initial quantum states can be all zeros, and each computation can be realized using corresponding quantum gates. A combination of computations can be represented using a sequence of quantum gates.

More particularly, each qubit can be expressed using a 2-dimensional (2D) vector $$\begin{pmatrix} a \\ b \end{pmatrix},$$

where $|a|^2+|b|^2=1$. In a quantum circuit, each quantum gate can represent a unitary matrix $U$ that satisfies condition $UU^+=I$, where $I$ is the identity matrix. Common quantum gates can include single-qubit gates (e.g., the Pauli-X (or X) gate, the Pauli-Y (or Y) gate, the Pauli-Z (or Z) gate, the I gate, the T gate, etc.) and two-qubit gates (e.g., the controlled NOT (CNOT) gate, the CZ gate, etc.).

The single-qubit quantum gates can be expressed as:

$$X = \begin{pmatrix} 0 & 1 \\ 1 & 0 \end{pmatrix}, Y = \begin{pmatrix} 0 & -i \\ i & 0 \end{pmatrix}, Z = \begin{pmatrix} 1 & 0 \\ 0 & -1 \end{pmatrix},$$

$$I = \begin{pmatrix} 1 & 0 \\ 0 & 1 \end{pmatrix}, \text{ and } T = \begin{pmatrix} 1 & 0 \\ 0 & e^{\frac{i\pi}{4}} \end{pmatrix}.$$

The two-qubit quantum gates can be expressed as:

$$CNOT = \begin{pmatrix} 1 & 0 & 0 & 0 \\ 0 & 1 & 0 & 0 \\ 0 & 0 & 0 & 1 \\ 0 & 0 & 1 & 0 \end{pmatrix} \text{ and } CZ = \begin{pmatrix} 1 & 0 & 0 & 0 \\ 0 & 1 & 0 & 0 \\ 0 & 0 & 1 & 0 \\ 0 & 0 & 0 & -1 \end{pmatrix}.$$

Each single-qubit quantum gate can change the state of a single qubit, and such a state changed can be realized by multiplexing the matrix corresponding to the gate with the vector representing the qubit (i.e., $$\begin{pmatrix} a \\ b \end{pmatrix}).$$

Similarly, a two-qubit quantum gates can change the states of two qubits.

FIG. 1 illustrates an exemplary quantum circuit for generating the three-qubit Greenberger, Home, and Zeilinger (GHZ) states. In the example in FIG. 1, quantum circuit 100 can include three quantum registers, as represented by the three horizontal lines. Moreover, quantum circuit 100 can include a number of Hadamard gates (H), such as gates 102 and 104, and a number of CZ gates, such as gates 106 and 108. The H gates are single-qubit gates and the CZ gates are two-qubit gates. Given the initial all-zero input, the output of quantum circuit 100 can be expressed as $$\frac{|000\rangle + |111\rangle}{\sqrt{2}}.$$

The output amplitude of a quantum circuit C can be expressed as: $\langle x|C|00L\,0\rangle$. Moreover, each quantum circuit can be decomposed according to the time of operation of each gate into a number of layers. For example, a quantum circuit C can be decomposed into d layers: $C=C_d\,L\,C_2C_1$, where $C_1, C_2, \ldots, C_d$ are unitary matrices applied onto the n qubits at time instants $t_1, t_2, \ldots, t_d$, respectively. In some embodiments, time instants $t_1, t_2, \ldots, t_d$ can represent clock cycles $1, 2, \ldots, d$, respectively. Hence, the output amplitude of such a quantum circuit can be expressed as:

$$\langle x|C|00L\,0\rangle = \sum_{\{i_1,i_2,\ldots,i_{d-1}\}} \langle x|C_d|i_{d-1}\rangle L\langle i_2|C_2|i_1\rangle\langle i_1|C_d|00L\,0\rangle.$$

Figure 2:
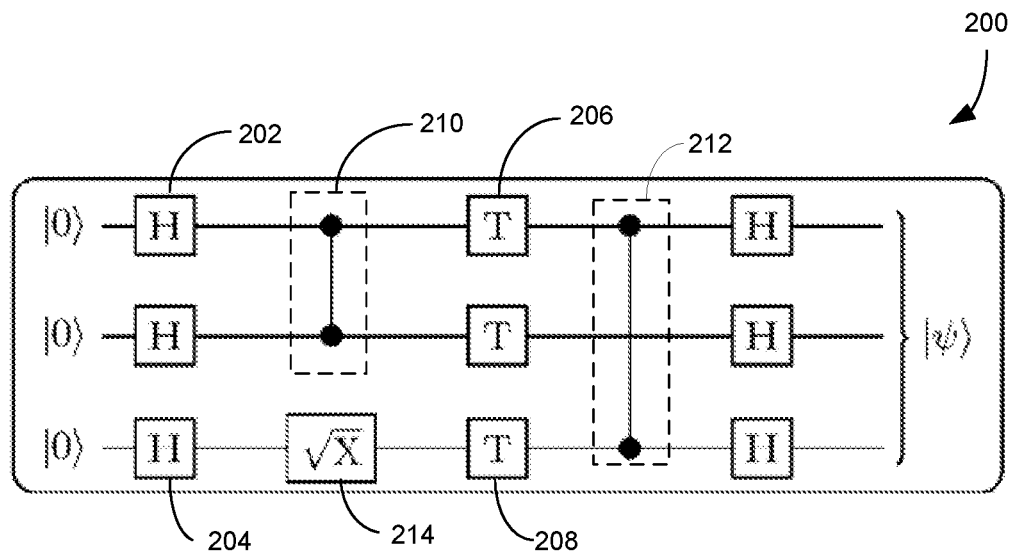
FIG. 2 illustrates another exemplary quantum circuit.

FIG. 2 illustrates another exemplary quantum circuit. Quantum circuit 200 can be applied onto three qubits and can have a depth of five layers. More specifically, quantum circuit 200 includes a number of H gates (e.g., H gates 202 and 204), a number of T gates (e.g., T gates 206 and 208), a number of CZ gates (e.g., CZ gates 210 and 212), and a square-root (SQRT) gate 214.

Given the five layers, quantum circuit 200 can be expressed as $C=C_5L\,C_2C_1$, where $C_1=H_1\otimes H_2\otimes H_3$, $C_2=CZ_{12}\otimes\sqrt{X_3}$, $C_3=T_1\otimes T_2\otimes T_3$, $C_4=CZ_{13}\otimes I_2$, and $C_5=H_1\otimes H_2\otimes H_3$. Accordingly, the output amplitude of quantum circuit 200 can be expressed as:

$$\langle x|C|00L\,0\rangle = \sum_{\{i_1,i_2,i_3,i_4\}} \langle x|C_5|i_4\rangle L\langle i_2|C_2|i_1\rangle\langle i_1|C|_100L\,0\rangle$$

$$= \sum_{\{i_1,i_2,i_3,i_4\}} \langle x|H_1\otimes H_2\otimes H_3|i_4\rangle\langle i_4|CZ_{13}\otimes I_2|i_3\rangle$$

$$\langle i_3|T_1\otimes T_2\otimes T_3|i_2\rangle\langle i_2|CZ_{12}\otimes\sqrt{X_3}|i_1\rangle$$

$$\langle i_1|H_1\otimes H_2\otimes H_3|00L\,0\rangle.$$

In the above equation, the summation is carried out over all four three-bit (0, 1) strings (i.e., $i_1,i_2,i_3,i_4$). Note that, because the T gate and the CZ gate are diagonal, when performing the summation, $\langle i_4|CZ_{13}\otimes I_2|i_3\rangle$ can be nonzero only when $i_3$ and $i_4$ are identical strings, $\langle i_3|T_1\otimes T_2\otimes T_3|i_2\rangle$ can be nonzero only when $i_2$ and $i_3$ are identical strings, and $\langle i_2|CZ_{12}\otimes\sqrt{X_3}|i_1\rangle$ can be nonzero only when the first two bits of $i_1$ and $i_2$ are identical. On the other hand, because the H gate is non-diagonal, no additional constraints can be applied to $\langle x|H_1\otimes H_2\otimes H_3|i_4\rangle$ and $\langle i_1|H_1\otimes H_2\otimes H_3|00L\,0\rangle$. In general, the multiplication within the summation can be nonzero only when $i_2=i_3=i_4$ and the first two bits of $i_1$ and $i_2$ are identical. Hence, when computing the summation, one only needs to take into consideration the bit strings $(i_1,i_2,i_3,i_4)$ that satisfy such conditions. In this particular example, although traversing all four 3-bit strings can have $2^{12}$ possibilities, the additional constraints have reduced the possibility to $2^4$. As one can see, by considering the diagonal gate constraints, one can significantly reduce the total number of terms during the simulation of the quantum circuit.

The procedures for applying the constraints can also be formulated in the language of undirected graphic models. Given the index sequences $(i_0=00L\,0, i_1, i_2.K, i_{d-1}, i_d=x)$ in the aforementioned equation of the circuit output, one can construct a graph G, where each distinct variable $i_k^{(j)}$ corresponds to a vertex, and two vertices are connected by an edge if there is an operator (e.g., a gate) acting on both of them.

Figure 3:
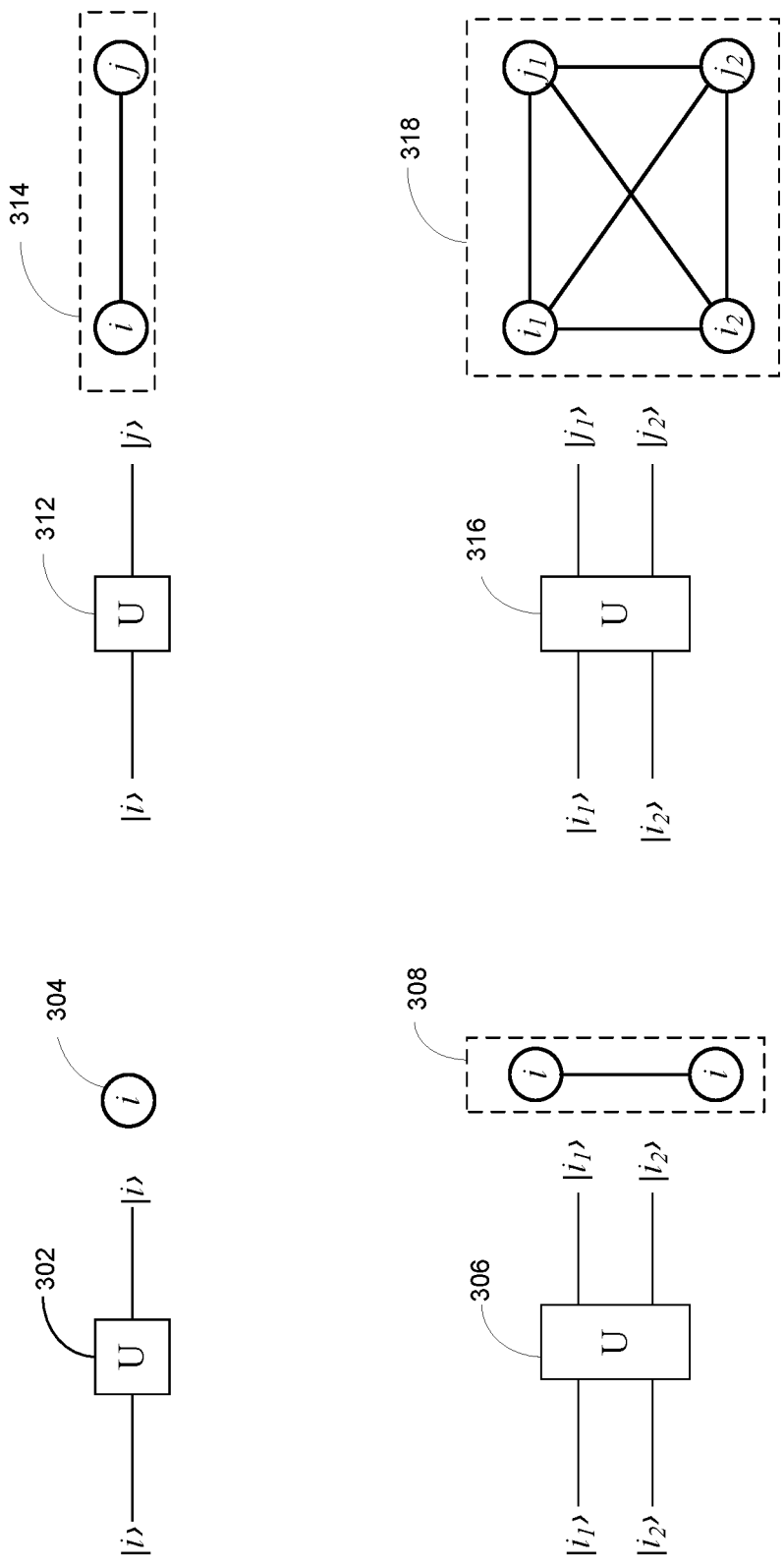
FIG. 3 illustrates the single-qubit and two-qubit diagonal and non-diagonal gates and their corresponding representations in the undirected graph, according to one embodiment.

As discussed previously, such a graph can be simplified if some tensor operators (e.g., gates) happen to be diagonal. For example, if two nodes (or vertices) are connected by a single-qubit diagonal gate, then the corresponding term in the summation can only survive (i.e., be nonzero) if the bit strings assigned for the two nodes are identical. Therefore, these two nodes can merge. FIG. 3 illustrates the single-qubit and two-qubit diagonal and non-diagonal gates and their corresponding representations in the undirected graph, according to one embodiment.

In FIG. 3, unitary gate 302 is a single-qubit diagonal gate and graphic element 304 is its graphical representation. As one can see, the two nodes have been merged into a single node. Similarly, two-qubit unitary gate 306 can be represented by graphic element 308. On the other hand, unitary gate 312 is non-diagonal, meaning that no merge occurs, as indicated by its graphical representation 314. Similarly, two-qubit non-diagonal unitary gate 316 can be represented in the undirected graph by graphic element 318.

Figure 4:
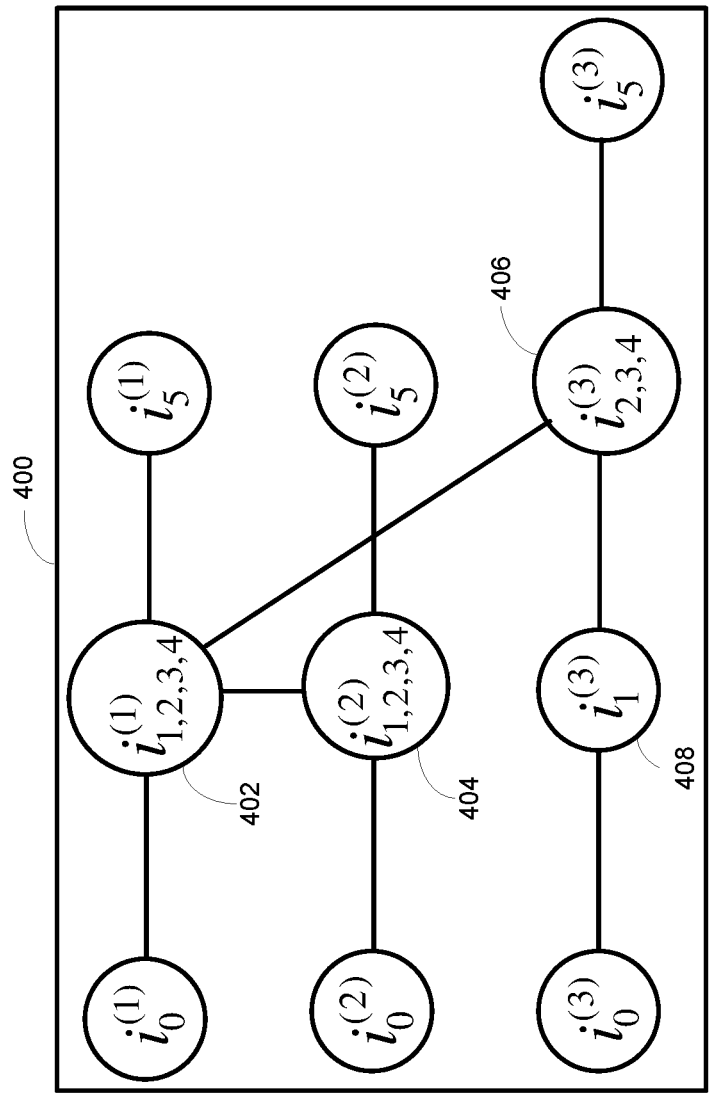
FIG. 4 illustrates the undirected graph for quantum circuit 200, according to one embodiment.

FIG. 4 illustrates the undirected graph for quantum circuit 200, according to one embodiment. As one can see from FIG. 4, undirected graph 400 can include a number of vertices and a number of edges connecting the vertices. Each vertex represents a variable $i_k^{(j)}$, with k representing the time index or clock cycle and j representing the bit position. As discussed previously, the first bits of bit strings $i_1, i_2, i_3$, and $i_4$ are identical and, hence, can be represented in undirected graph 400 by a single vertex 402. Similarly, the second bits of bit strings $i_1, i_2, i_3$, and $i_4$ can be represented using a single vertex 404 in undirected graph 400, and the third bits of bit strings $i_2, i_3$, and $i_4$ can be represented using a single vertex 406. On the other hand, the third bit of $i_1$ is represented by a separate vertex 408. Undirected graph 400 also includes other vertices representing the input $(i_0)$ and the output $(i_5)$.

As discussed previously, the amplitude of circuit 200 can be calculated using:

$$\langle x|C|00L\,0\rangle = \sum_{\{i_1,i_2,i_3,i_4\}} \langle x|H_1\otimes H_2\otimes H_3|i_4\rangle\langle i_4|CZ_{13}\otimes I_2|i_3\rangle$$

$$\langle i_3|T_1\otimes T_2\otimes T_3|i_2\rangle\langle i_2|CZ_{12}\otimes\sqrt{X_3}|i_1\rangle\langle i_1|H_1\otimes H_2\otimes H_3|00L\,0\rangle.$$

Such a summation can also be referred to as an expansion of the Feynman path integral.

When x=010, the Feynman path integral can be calculated as:

$$\langle 010|C|000\rangle = \sum_{\{i_1,i\}} \langle 010|H_1\otimes H_2\otimes H_3|i\rangle\langle i|CZ_{13}\otimes I_2|i\rangle$$

$$\langle i|T_1\otimes T_2\otimes T_3|i\rangle\langle i|CZ_{12}\otimes\sqrt{X_3}|i_1\rangle\langle i_1|H_1\otimes H_2\otimes H_3|000\rangle.$$

Figure 5:
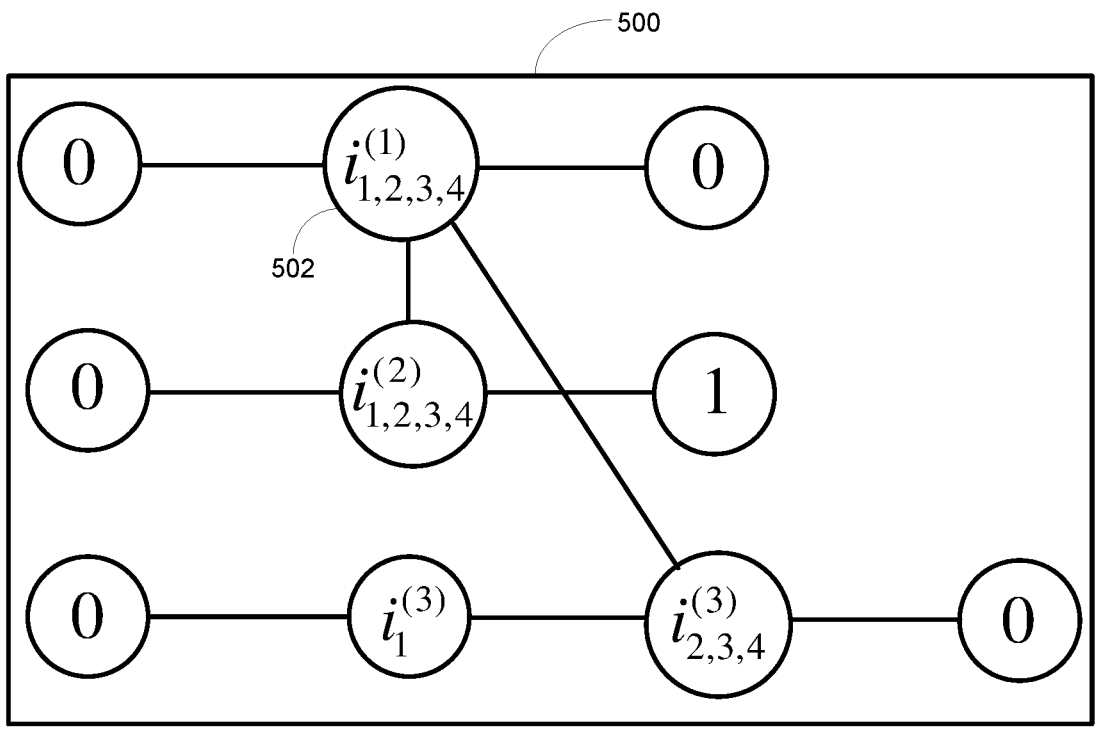
FIG. 5 illustrates the undirected graph for quantum circuit 200 given x=010, according to one embodiment.

The undirected graph corresponding to the above expression is shown in FIG. 5. In other words, FIG. 5 illustrates the undirected graph for quantum circuit 200 given x=010, according to one embodiment.

Undirected graph 500 shown in FIG. 5 can be simplified using a tensor contraction algorithm by eliminating one variable (e.g., vertex) at a time to simplify the graph. For example, an initial complex graph of a certain depth can be simplified to have a reduced depth. In addition to tensor contraction, another straightforward way to evaluate the summation is to split the sum into pieces. More specifically, one can simply choose any variable and evaluate the summation twice, once with the value of the chosen variable fixed to 0 and once with the value of the chosen variable fixed to 1, and then combine the outcomes. Similar to eliminating a variable, fixing the value of a variable also removes it from the summation. In the undirected graph model, fixing the value of a variable translates to removing the corresponding vertex along with all of its edges.

In graph 500 shown in FIG. 5, vertex 502 (which corresponds to variable $i_{1,2,3,4}^{(1)}$) is coupled to two CZ gates (CZ gates 210 and 212 as shown in FIG. 2). Hence, removing vertex 502 can result in the removal of both CZ gates. Note that, each time a vertex is removed, the system needs to recursively evaluate the resulting graph twice and the number of evaluations blows up exponentially. If the two CZ gates are removed one by one, the system needs to perform four subtasks of graph evaluation. However, by removing the two CZ gates simultaneously, the system only needs to perform two, instead of four, subtasks, thus significantly enhancing the computation efficiency. Also note that removing a vertex means that the graph evaluation can be divided into subtasks that can be performed in parallel. For example, removing M vertices from the graph means dividing the graph evaluation task into $2^M$ subtasks that can be performed in parallel.

In the example shown in FIG. 5, given $i_1$=abc and i=abd, one can obtain:

$$\langle 010|C|000\rangle = \sum_{\{i_1=abc, i=abd\}} \langle 010|H_1 \otimes H_2 \otimes H_3|abd\rangle$$
$$\langle abd|CZ_{13} \otimes I_2|abd\rangle\langle abd|T_1 \otimes T_2 \otimes T_3|abd\rangle$$
$$\langle abd|CZ_{12} \otimes \sqrt{X_3}|abc\rangle\langle abc|H_1 \otimes H_2 \otimes H_3|000\rangle,$$

or, $$\langle 010|C|000\rangle = \sum_{\{a,b,b,d\in\{0,1\}\}} \langle 010|H_1 \otimes H_2 \otimes H_3|abd\rangle$$
$$\langle abd|CZ_{13} \otimes I_2|abd\rangle\langle abd|T_1 \otimes T_2 \otimes T_3|abd\rangle$$
$$\langle abd|CZ_{12} \otimes \sqrt{X_3}|abc\rangle\langle abc|H_1 \otimes H_2 \otimes H_3|000\rangle.$$

Removing variable $i_{1,2,3,4}^{(1)}$ corresponds to removing index a, which is the vertex corresponding to the index in the Feynman path integral. Moreover, removing $i_{1,2,3,4}^{(1)}$ requires the evaluation of:

$$\langle 010|C|000\rangle = \sum_{\{i_1=bc, i=bd\}} \langle 010|H_1 \otimes H_2 \otimes H_3|0bd\rangle$$
$$\langle 0bd|CZ_{13} \otimes I_2|0bd\rangle\langle 0bd|T_1 \otimes T_2 \otimes T_3|0bd\rangle$$
$$\langle 0bd|CZ_{12} \otimes \sqrt{X_3}|0bc\rangle\langle 0bc|H_1 \otimes H_2 \otimes H_3|000\rangle +$$
$$\sum_{\{i_1=bc, i=bd\}} \langle 010|H_1 \otimes H_2 \otimes H_3|1bd\rangle\langle 1bd|CZ_{13} \otimes I_2|1bd\rangle$$
$$\langle 1bd|T_1 \otimes T_2 \otimes T_3|1bd\rangle\langle 1bd|CZ_{12} \otimes \sqrt{X_3}|1bc\rangle$$
$$\langle 1bc|H_1 \otimes H_2 \otimes H_3|000\rangle,$$

or, $$\langle 010|C|000\rangle = \sum_{\{b,c,d\in\{0,1\}\}} \langle 010|H_1 \otimes H_2 \otimes H_3|0bd\rangle$$
$$\langle 0bd|CZ_{13} \otimes I_2|0bd\rangle\langle 0bd|T_1 \otimes T_2 \otimes T_3|0bd\rangle$$
$$\langle 0bd|CZ_{12} \otimes \sqrt{X_3}|0bc\rangle\langle 0bc|H_1 \otimes H_2 \otimes H_3|000\rangle +$$
$$\sum_{\{b,c,d\in\{0,1\}\}} \langle 010|H_1 \otimes H_2 \otimes H_3|1bd\rangle\langle 1bd|CZ_{13} \otimes I_2|1bd\rangle$$
$$\langle 1bd|T_1 \otimes T_2 \otimes T_3|1bd\rangle\langle 1bd|CZ_{12} \otimes \sqrt{X_3}|1bc\rangle$$
$$\langle 1bc|H_1 \otimes H_2 \otimes H_3|000\rangle.$$

The summation can be further simplified by removing the coupled T gate (e.g., T gate 206 shown in FIG. 2), resulting in:

$$\langle 010|C|000\rangle = \frac{1}{2}\Bigg(\langle 0|T_1|0\rangle \sum_{\{i_1=bc, i=bd\}} \langle 10|H_2 \otimes H_3|bd\rangle\langle 0bd|CZ_{13} \otimes I_2|0bd\rangle$$
$$\langle bd|T_2 \otimes T_3|bd\rangle\langle 0bd|CZ_{12} \otimes \sqrt{X_3}|0bc\rangle\langle bc|H_2 \otimes H_3|00\rangle +$$
$$\langle 1|T_1|1\rangle \sum_{\{i_1=bc, i=bd\}} \langle 10|H_2 \otimes H_3|bd\rangle\langle 1bd|CZ_{13} \otimes I_2|1bd\rangle$$
$$\langle bd|T_2 \otimes T_3|bd\rangle\langle 1bd|CZ_{12} \otimes \sqrt{X_3}|1bc\rangle\langle bc|H_2 \otimes H_3|00\rangle\Bigg),$$

or, $$\langle 010|C|000\rangle = \frac{1}{2}\Bigg(\langle 0|T_1|0\rangle \sum_{\{b,c,d\in\{0,1\}\}} \langle 10|H_2 \otimes H_3|bd\rangle\langle 0bd|CZ_{13} \otimes I_2|0bd\rangle$$
$$\langle bd|T_2 \otimes T_3|bd\rangle\langle 0bd|CZ_{12} \otimes \sqrt{X_3}|0bc\rangle\langle bc|H_2 \otimes H_3|00\rangle +$$
$$\langle 1|T_1|1\rangle \sum_{\{b,c,d\in\{0,1\}\}} \langle 10|H_2 \otimes H_3|bd\rangle\langle 1bd|CZ_{13} \otimes I_2|1bd\rangle$$
$$\langle bd|T_2 \otimes T_3|bd\rangle\langle 1bd|CZ_{12} \otimes \sqrt{X_3}|1bc\rangle\langle bc|H_2 \otimes H_3|00\rangle\Bigg).$$

Note $\langle 0|CZ_{13}|0\rangle = I_3$ and $\langle 1|CZ_{13}|1\rangle = Z_3$; hence, $$\langle 010|C|000\rangle =$$
$$\frac{1}{2}\Bigg(\langle 0|T_1|0\rangle \sum_{\{i_1=bc, i=bd\}} \langle 10|H_2 \otimes H_3|bd\rangle\langle bd|I_3 \otimes I_2|bd\rangle\langle bd|T_2 \otimes T_3|bd\rangle$$
$$\langle bd|I_2 \otimes \sqrt{X_3}|bc\rangle\langle bc|H_2 \otimes H_3|00\rangle +$$
$$\langle 1|T_1|1\rangle \sum_{\{i_1=bc, i=bd\}} \langle 10|H_2 \otimes H_3|bd\rangle\langle bd|Z_3 \otimes I_2|bd\rangle$$
$$\langle bd|T_2 \otimes T_3|bd\rangle\langle bd|Z_2 \otimes \sqrt{X_3}|bc\rangle\langle bc|H_2 \otimes H_3|00\rangle\Bigg),$$

or, $$\langle 010|C|000\rangle =$$
$$\frac{1}{2}\Bigg(\langle 0|T_1|0\rangle \sum_{\{b,c,d\in\{0,1\}\}} \langle 10|H_2 \otimes H_3|bd\rangle\langle bd|I_3 \otimes I_2|bd\rangle\langle bd|T_2 \otimes T_3|bd\rangle$$
$$\langle bd|I_2 \otimes \sqrt{X_3}|bc\rangle\langle bc|H_2 \otimes H_3|00\rangle +$$
$$\langle 1|T_1|1\rangle \sum_{\{b,c,d\in\{0,1\}\}} \langle 10|H_2 \otimes H_3|bd\rangle\langle bd|Z_3 \otimes I_2|bd\rangle$$
$$\langle bd|T_2 \otimes T_3|bd\rangle\langle bd|Z_2 \otimes \sqrt{X_3}|bc\rangle\langle bc|H_2 \otimes H_3|00\rangle\Bigg).$$

Figure 6:
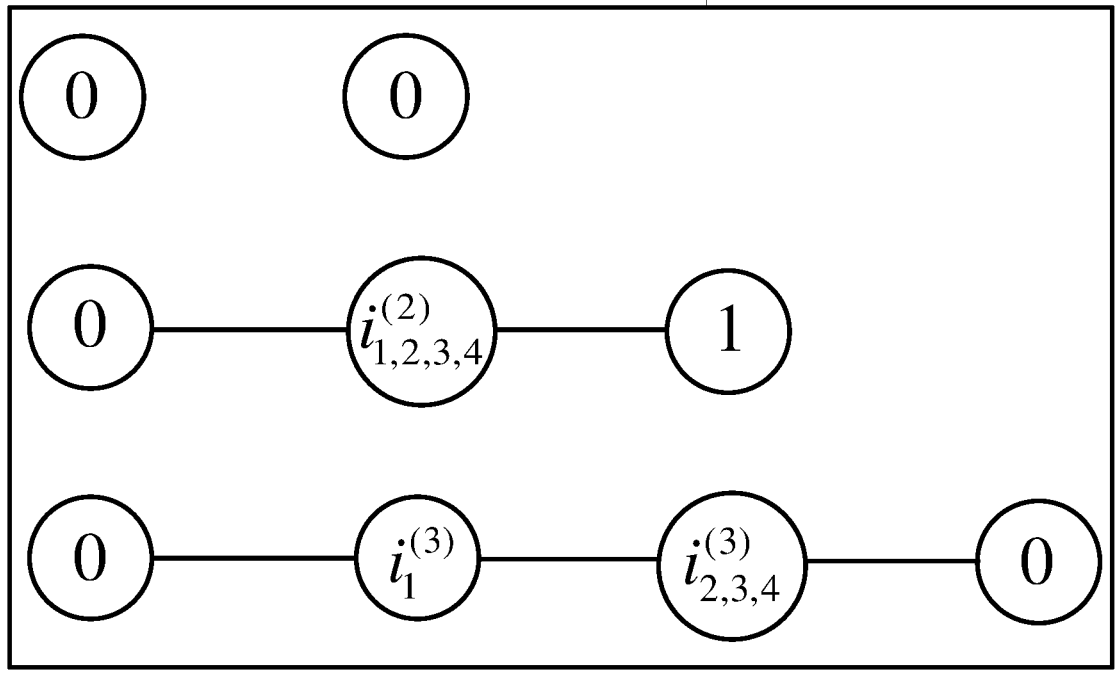
FIG. 6 illustrates the undirected graph for quantum circuit 200 after the removal of the two CZ gates and a connected T gate, according to one embodiment.

One can also represent the terms in the summation using undirected graphs, such as terms $\langle 10|(H_2\otimes H_3)(I_3\otimes I_2)(T_2\otimes T_3)(I_2\otimes\sqrt{X_3})(H_2\otimes H_3)|00\rangle$ and $\langle 10|(H_2\otimes H_3)(Z_3\otimes I_2)$ $(T_2 \otimes T_3)(Z_2 \otimes \sqrt{X_3})(H_2 \otimes H_3)|00\rangle$. FIG. 6 illustrates the undirected graph for quantum circuit 200 after the removal of the two CZ gates and a connected T gate, according to one embodiment. Compared to undirected graph shown in FIG. 5, undirected graph 600 shown in FIG. 6 includes fewer vertices and edges, thus making evaluating such a graph a much simpler task. In other words, evaluating the original undirected graph shown in FIG. 5 can now be performed by evaluating the simpler graph (also referred to as a sub-graph) shown in FIG. 6.

Figure 7:
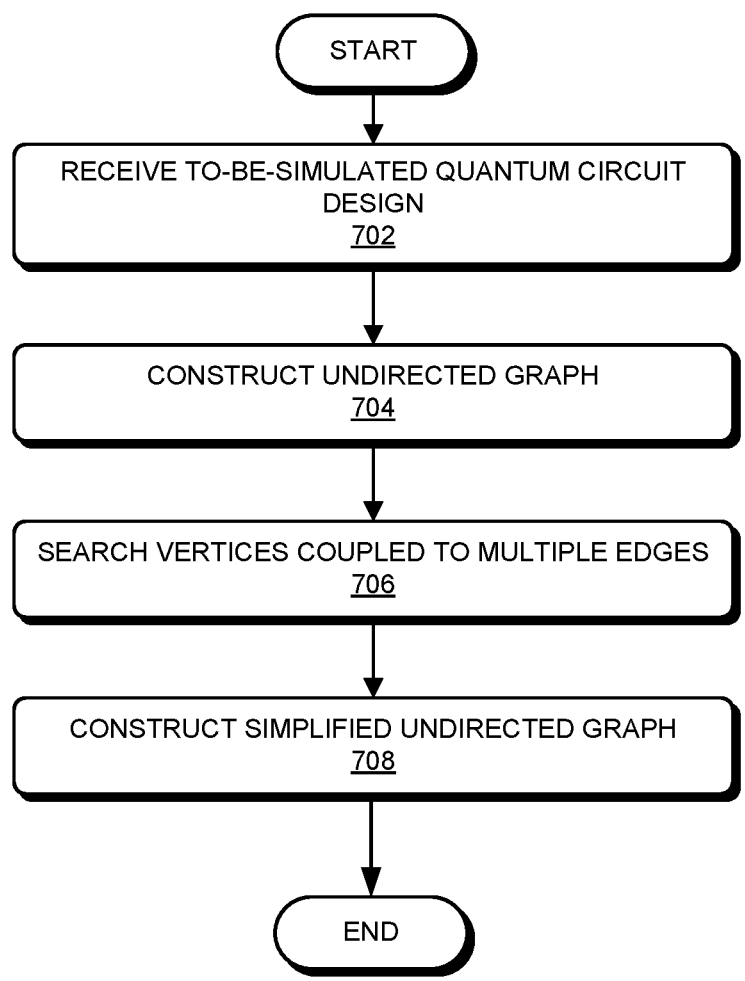
FIG. 7 presents a flowchart illustrating an exemplary process for simulating a quantum circuit, according to one embodiment.

In addition to the relatively simple quantum circuit 200, the disclosed system and method can also be used for the classical simulation of intermediate-size (50 qubits and beyond) quantum circuits. FIG. 7 presents a flowchart illustrating an exemplary process for simulating a quantum circuit, according to one embodiment.

During operation, the system receives a to-be-simulated quantum circuit design (operation 702). In some embodiments, the quantum circuit can have an intermediate size, i.e., it operates on 50 or more qubits to a reasonable depth (e.g., a depth of greater than 20). The system can then construct an undirected graph based on the quantum circuit (operation 704). More specifically, given a quantum circuit C, the system formulates the amplitude of the bit string x as $\langle x|C| 00L\ 0 \rangle$, which can be calculated using the Feynman path integral. Given the index sequences ($i_0$=0L 0,$i_1$,$i_2$,$i_{d-1}$, $i_d$=x), each distinct variable $i_k^{(j)}$ corresponds to a vertex in the constructed undirected graph, and two vertices can be connected by an edge if there is an operator acting on both of them. Note that variables having the same value correspond to the same vertex, and variables having different values correspond to different vertices. Each term in the Feynman path integral then corresponds to a complex number associated with labeling all vertices in the graph by {0,1}. Some vertices are connected to at least one single-qubit gate, and some vertices are connected to at least one two-qubit gate. Moreover, some vertices can be connected to multiple two-qubit gates or a combination of single- and two-qubit gates. In the example shown in FIG. 5, vertex 502 is connected to a single-qubit gate (i.e., a T gate) and two two-qubit gates (i.e., two CZ gates).

Subsequently, the system searches the undirected graph for vertices that are coupled to multiple edges (operation 706). In some embodiments, the system identifies at least one vertex that is coupled to two edges, with each edge representing at least a two-qubit gate. For example, the system can identify at least one vertex coupled to two CZ gates. The system can then construct a simplified or reduced undirected graph (sometimes referred to as a sub-graph) by removing at least one vertex that is coupled to multiple edges (operation 708). Note that removing the vertex can also result in the removal of the connecting edges, which correspond to quantum gates. For example, if a vertex is connected to two CZ gates, removing such a vertex can result in the simultaneous removal of both CZ gates. In some embodiments, the system can remove the identified vertices one at a time. Each time such a vertex is removed, the system can divide the task of evaluating the undirected graph into two subtasks, with each subtask being evaluating the sub-graph. Alternatively, the system can remove multiple (e.g., two) identified vertices simultaneously. In such a scenario, the task can be divided into $2^m$ subtasks, where m is the number of removed vertices.

Note that removing vertices from the undirected graph does not guarantee the reduction of the time and space complexity of the simulation. As discussed previously, removing a vertex often means dividing one simulation task into two sub-tasks, because the simplified undirected graph needs to be evaluated twice, one for each value of the removed vertex. If the system merely randomly removes vertices, the number of sub-tasks can explode. Therefore, the vertex removal should be performed strategically. For example, by removing a vertex that is coupled to multiple gates, one can simultaneously remove the multiple gates (e.g., two CZ gates). This means that only two sub-tasks are generated as a result of the removal, thus reducing the complexity and depth of the simplified undirected graph at a smaller cost. As a result, the overall computation efficiency can be improved.

For a computer cluster having $2^m$ parallel computing units, the simulation task can be divided into $2^m$ subtasks by removing m vertices that are coupled to CZ-gate pairs. Each such subtask can be more efficient than the situation where a random vertex is removed. Tests have shown that, when 12 vertices are removed using this strategy from a quantum circuit of size 8×8×40, one can effectively reduce the treewidth of the undirected graph by 5, compared to the case where the gates are removed one at a time. In other words, by removing two gates simultaneously each time and by removing 12 such vertices, one can reduce the time and space complexity of each subtask to 1/32 of that of the subtask where 12 random vertices are removed. Note that 12 vertices can correspond to 4096 parallel processes that can be processed by a computer cluster having 40 nodes, with each node having 96 cores. Such a computer cluster can be achieved using current technology. Larger computer clusters can facilitate a larger number of subtasks, thereby making the proposed simulation algorithm more efficient.

Figure 8:
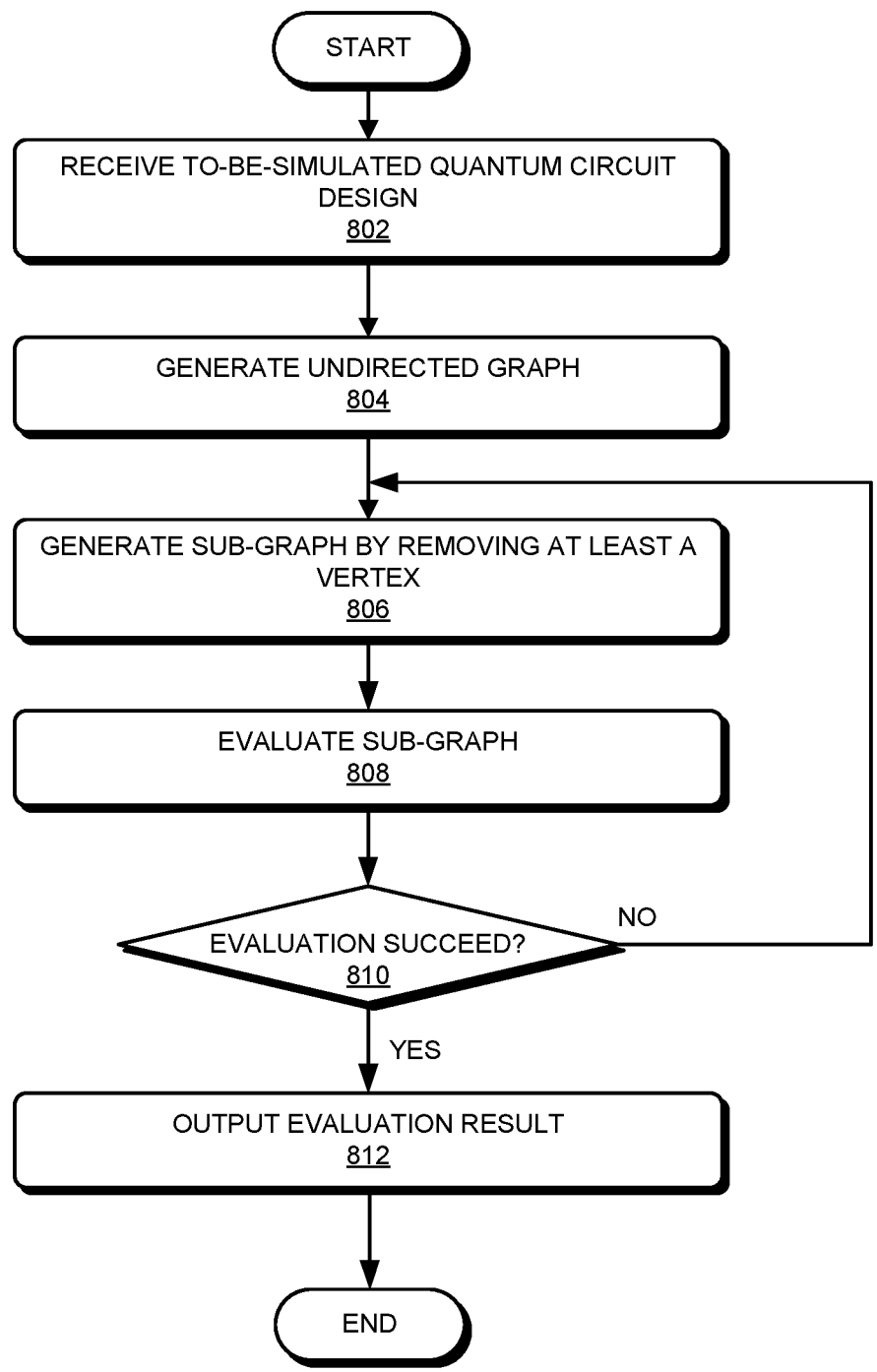
FIG. 8 presents a flowchart illustrating an exemplary process for simulating an intermediate-sized quantum circuit, according to one embodiment.

FIG. 8 presents a flowchart illustrating an exemplary process for simulating an intermediate-sized quantum circuit, according to one embodiment. During operation, the system receives a to-be-simulated quantum circuit (operation 802) and generates an undirected graph based on the to-be-simulated quantum circuit (operation 804). The quantum circuit can be of any size or dimension. For example, the quantum circuit can be a 2-dimensional (2D) lattice circuit. Such a structure can include a hierarchy of an M×N single-qubit matrix, where M and N are positive integers. Other types of circuit format are also possible. The size of the quantum circuit that can be classically simulated is often limited by computation power and resources. In some embodiments, the quantum circuit can have at least 50 qubits and a depth of at least 30. More specifically, a quantum circuit having up to 100 qubits and a depth up to 40 can be effectively simulated. In some embodiments, a respective edge of the undirected graph corresponds to one or more two-qubit gates in the to-be-simulated quantum circuit, and a respective vertex in the undirected graph corresponds to indices of the Feynman path integral having the same value. Note that indices of the Feynman path integral having different values correspond to different vertices in the undirected group. The system can then generate a sub-graph by removing one or more vertices from the undirected graph (operation 806). For example, the system can reduce the undirected graph to a sub-graph by removing one vertex.

There are different types of vertices in the undirected graph. Some vertices are coupled to unitary gate(s), some vertices are coupled to two-qubit gate(s), and some are coupled to a combination of unitary and two-qubit gates. Although the removal of certain vertices in the undirected graph can reduce the time and space complexity of the quantum circuit, not all vertices, when removed, can result in the reduction of the time and space complexity. In some embodiments, the system selects vertices that are simultaneously coupled to at least two two-qubit gates (i.e., vertices that are connected to at least two edges) for removal. Such a vertex can sometimes be referred to as an intersection vertex. In order to identify intersection vertices within an undirected graph, in some embodiments, the system can traverse all vertices in the entire undirected graph. Alternatively, the system can exam all two-qubit gates in the quantum circuit. For each two-qubit gate, the system identifies a pair of vertices coupled to the two-qubit gate in the undirected graph, and by finding duplicated vertices, the system can identify vertices that are simultaneously coupled to multiple gates. In some embodiments, the two-qubit gates are diagonal gates, such as CZ gates.

When performing tensor contraction on the undirected graph, the variable elimination ordering can significantly affect the time complexity of the simulation. To enhance the tensor-contraction effect, in some embodiments, the system can use a treewidth-computation algorithm (e.g., the QuickBB algorithm) to determine the treewidth of the undirected graph in order to obtain a better elimination ordering. For example, the system can output a tensor-contraction strategy that includes an ordered list of vertices, which indicates the ordering of removal of these vertices. During operation, the system can remove, according to the ordered list, one vertex at a time from the undirected graph to obtain an optimal solution within a predetermined time period.

In addition, because the removal of different gates can result in different tensor-contraction effects, it can also have different effects on the reduction of the time and space complexity of the quantum circuit. In some embodiments, to obtain the maximum tensor-contraction effect, the system may choose not to remove certain vertices in the ordered list. More specifically, if the removal of a vertex only results in minimum or poor tensor contraction, the system may skip removing such a vertex. In some embodiments, the system can use a predetermined strategy to select intersection vertices (i.e., vertices coupled to at least two two-qubit gates) for removal. For example, it is desirable to remove intersection vertices that can introduce a stronger tensor-contraction effect when removed. In some embodiments, when removing the intersection vertices, the system can select to-be-removed vertices using a predetermined algorithm (e.g., a greedy algorithm or a dynamic-programming algorithm).

When performing the greedy algorithm, the system can first determine a selection range (e.g., a candidate set) for the greedy algorithm based on the tensor-contraction order, and then the system can select, within the selection range, to-be-removed vertices based on a predetermined objective function. In some embodiments, the objective function can be used to evaluate the execution time of remaining subtasks subsequent to the removal of a to-be-removed vertex. It is desirable to ensure that the execution time of the remaining subtasks is kept to a minimum.

The greedy algorithm follows the problem-solving heuristic of making a locally optimal choice at each stage with the intent of finding a global optimum. In other words, it attempts to make the choice that seems to be the best at the moment without considering further choices. Although it does not usually produce an optimal solution, it can provide locally optimal solutions that approximate a global optimal solution in a reasonable amount of time. It is important to choose a greedy strategy that does not have an aftereffect (i.e., what happened prior to a current state only influences the current state, not future states).

The greedy algorithm can provide a simpler and faster tool for solving certain optimization problems. It performs the optimization step by step, and makes an optimized choice based on the current state and a certain optimization criterion without considering all possible future choices. It can reduce the amount of time needed for finding the global optimization. The greedy algorithm uses a top-down approach to iteratively make sequential greedy choices. Each greedy choice can reduce the problem to a simpler sub-problem. At each step, a local optimum is found. However, it does not guarantee the global optimum, and the greedy algorithm does not backtrack. Using the greedy algorithm to locate to-be-removed vertices that are connected to at least two two-qubit gates can reduce the amount of time needed for finding the global optimum.

In some embodiments, when selecting a to-be-removed vertex, the system may traverse all intersection vertices included in the ordered list of tensor contraction, and calculate, for each vertex, the predicted execution time of remaining subtasks. The predicted execution time can be calculated based on the tensor-contraction order. For example, the system may use the tensor rank of the undirected graph subsequent to removing a first vertex on the ordered list to obtain indices. Subsequent to removing a second vertex on the ordered list from the undirected graph, the system adds the indices of the tensor rank. The system obtains the predicted execution time until all vertices on the ordered list have been removed. The system can then use the greedy algorithm to determine the vertex that corresponds to the least amount of predicted execution time (i.e., removing such a vertex can result in a minimal execution time for remaining subtasks).

Dynamic programming (DP), on the other hand, breaks down an optimization problem into simpler sub-problems. The solution of a prior sub-problem can provide useful information for finding a solution for a next sub-problem. When solving a sub-problem, the DP algorithm enumerates possible local solutions, and strategically keeps local solutions that can achieve a local optimum while discarding other solutions. The solution of the last sub-problem will be the solution of the initial problem. Many problems solved by DP have sub-problems that are recursive and, hence, storing the solution of each sub-problem so that each sub-problem is only solved once can eliminate duplicated computation and increase efficiency. The solution of each sub-problem (e.g., the states at different stages) can be stored in a 2D array (e.g., a hash table).

In some embodiments, removing an intersection vertex from the undirected graph can involve removing indices of the Feynman path integral corresponding to the vertex. Each time such an intersection vertex is removed, at least two two-qubit gates are removed. Moreover, because the vertex corresponds to indices in the Feynman path integral, removing such a vertex can also result in the removal of other quantum gates relating to such indices.

Subsequent to reducing the undirected graph to a sub-graph, the system can evaluate the sub-graph (operation 808) and determines whether the evaluation succeeds (operation 810). If the evaluation succeeds, the system outputs the evaluation result (operation 812). Otherwise, the system continues to generate a sub-graph of the current sub-graph by removing an additional vertex (operation 806). In some embodiments, an original undirected graph can be split into multiple sub-graphs, and each sub-graph can be evaluated separately. The evaluation result of the sub-graphs can be combined to generate a final result. Such a result can then be used for simulating the behavior of the quantum circuit.

Figure 9:
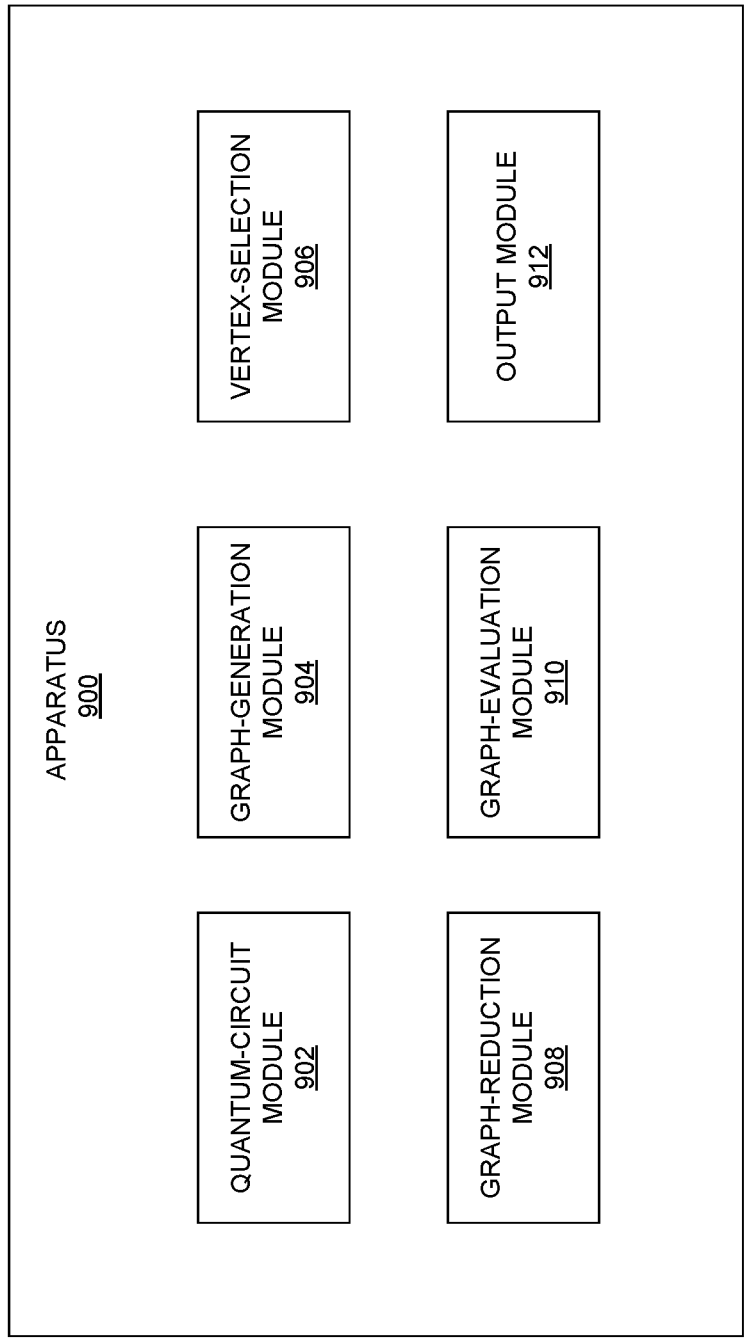
FIG. 9 illustrates an apparatus for simulating a quantum circuit, according to one embodiment.

FIG. 9 illustrates an apparatus for simulating a quantum circuit, according to one embodiment. Apparatus 900 includes a quantum-circuit module 902, a graph-generation module 904, a vertex-selection module 906, a graph-reduction module 908, a graph-evaluation module 910, and an output module 912. Quantum-circuit module 902 can include quantum gates and quantum registers. The quantum gates operate on qubits and the quantum registers store initial quantum states used for quantum computation and transient quantum states during the quantum computation. Graph-generation module 904 can be responsible for generating the undirected graph based on the quantum circuit. Vertex-selection module 906 can be responsible for selecting to-be-removed vertices. In some embodiments, vertex-selection module 906 can use a treewidth computation algorithm to determine the tensor-contraction order and use a greedy algorithm to select to-be-removed vertices. In some embodiments, each to-be-removed vertex is coupled to at least two two-qubit quantum gates.

Graph-reduction module 908 can be responsible for reducing the undirected graph to one or more sub-graphs. For example, a sub-graph can be generated by removing one vertex that is coupled to two two-qubit gates from the undirected graph. Moreover, a further sub-graph can be generated by removing an additional vertex that is coupled to two two-qubit gates from the current sub-graph. Graph-evaluation module 910 can be responsible for evaluating the sub-graphs and output module 912 can be responsible for outputting the evaluation result.

In general, embodiments of the present invention provide a system and method that facilitates classical simulation of an intermediate-sized quantum circuit. More specifically, the quantum circuit can be modeled using an undirected graph. By appropriately choosing vertices to eliminate in the undirected graphical model, embodiments of the present invention can significantly reduce the treewidth of the undirected graph compared to selecting vertices at random Eliminating vertices from the undirected graph divides the graph-evaluation task into a number of sub-tasks, thus enabling parallel processing, because each sub-task can be performed independently. To enhance computation efficiency, in some embodiments, the system selects vertices that are coupled to at least two edges, with each edge corresponding to a multiple-qubit gate (e.g., a CZ gate) for elimination. In further embodiments, a greedy algorithm is used for selecting to-be-removed vertices. To increase efficiency of the greedy algorithm, the system first uses a treewidth computation algorithm (e.g., the QuickBB algorithm) to compute the variable elimination ordering, and applies the greedy algorithm based on the ordering. Other optimization algorithm (e.g., the DP algorithm) can also be used to identify to-be-removed vertices from the undirected graph.

Figure 10:
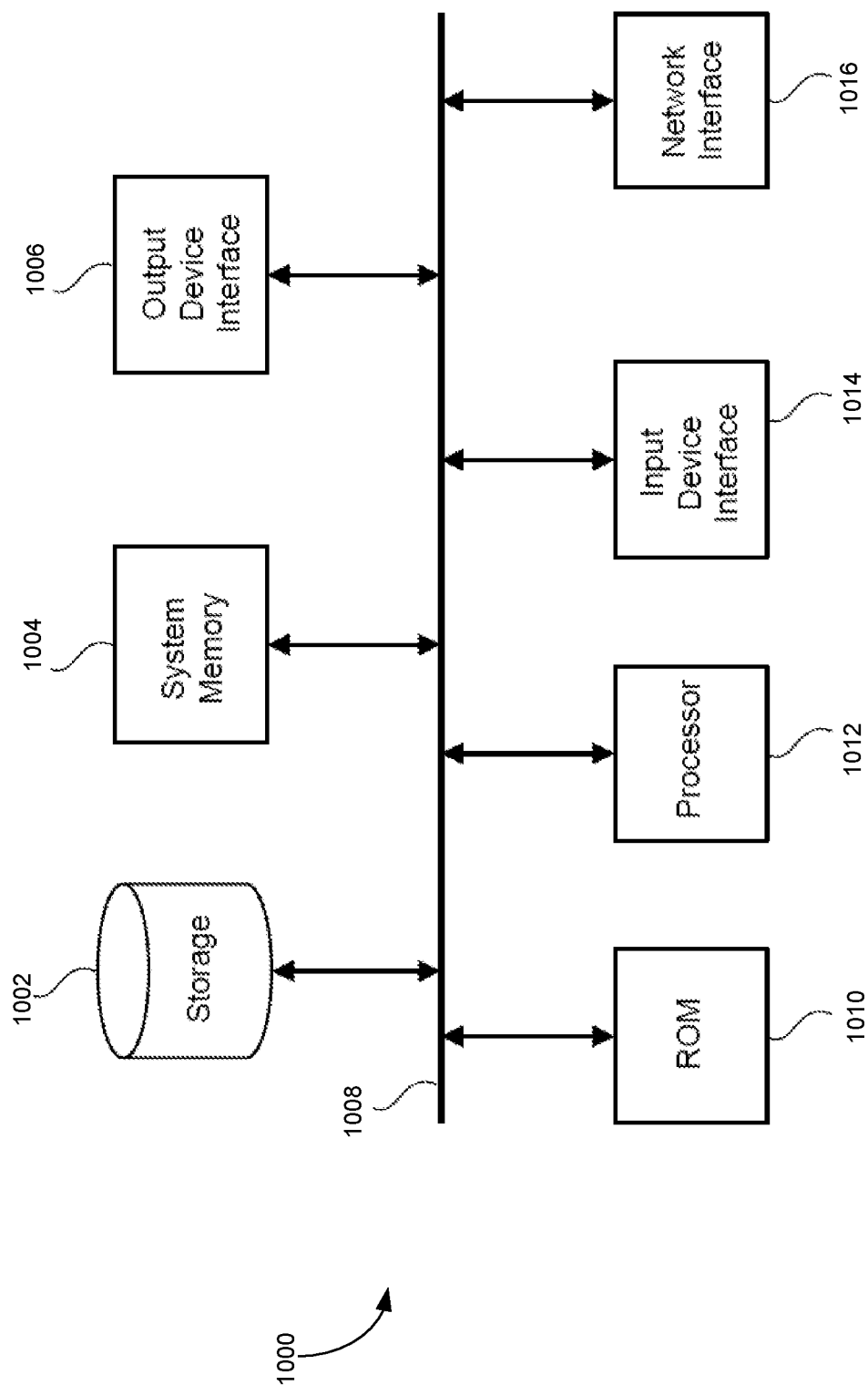
FIG. 10 conceptually illustrates an electronic system, which implements the subject technology, according to one embodiment.

FIG. 10 conceptually illustrates an electronic system, which implements the subject technology, according to one embodiment. Electronic system 1000 can be a client, a server, a computer, a smartphone, a PDA, a laptop, or a tablet computer with one or more processors embedded therein or coupled thereto, or any other sort of electronic device. Such an electronic system includes various types of computer-readable media and interfaces for various other types of computer-readable media. Electronic system 1000 includes a bus 1008, processing unit(s) 1012, a system memory 1004, a read-only memory (ROM) 1010, a permanent storage device 1002, an input device interface 1014, an output device interface 1006, and a network interface 1016.

Bus 1008 collectively represents all system, peripheral, and chipset buses that communicatively connect the numerous internal devices of electronic system 1000. For instance, bus 1008 communicatively connects processing unit(s) 1012 with ROM 1010, system memory 1004, and permanent storage device 1002.

From these various memory units, processing unit(s) 1012 retrieves instructions to execute and data to process in order to execute the processes of the subject disclosure. The processing unit(s) can be a single processor or a multi-core processor in different implementations.

ROM 1010 stores static data and instructions that are needed by processing unit(s) 1012 and other modules of electronic system 1000. Permanent storage device 1002, on the other hand, is a read-and-write memory device. This device is a non-volatile memory unit that stores instructions and data even when electronic system 1000 is off. Some implementations of the subject disclosure use a mass-storage device (such as a magnetic or optical disk and its corresponding disk drive) as permanent storage device 1002.

Other implementations use a removable storage device (such as a floppy disk, flash drive, and its corresponding disk drive) as permanent storage device 1002. Like permanent storage device 1002, system memory 1004 is a read-and-write memory device. However, unlike storage device 1002, system memory 1004 is a volatile read-and-write memory, such as a random access memory. System memory 1004 stores some of the instructions and data that the processor needs at runtime. In some implementations, the processes of the subject disclosure are stored in system memory 1004, permanent storage device 1002, and/or ROM 1010. From these various memory units, processing unit(s) 1012 retrieves instructions to execute and data to process in order to execute the processes of some implementations.

Bus 1008 also connects to input and output device interfaces 1014 and 1006, respectively. Input device interface 1014 enables the user to communicate information to and select commands for the electronic system. Input devices used with input device interface 1014 include, for example, alphanumeric keyboards and pointing devices (also called "cursor control devices"). Output device interface 1006 enables, for example, the display of images generated by electronic system 1000. Output devices used with output device interface 1006 include, for example, printers and display devices, such as cathode ray tubes (CRT) or liquid crystal displays (LCD). Some implementations include devices such as a touchscreen that functions as both input and output devices.

Finally, as shown in FIG. 10, bus 1008 also couples electronic system 1000 to a network (not shown) through a network interface 1016. In this manner, the computer can be a part of a network of computers (such as a local area network ("LAN"), a wide area network ("WAN"), or an Intranet, or a network of networks, such as the Internet. Any or all components of electronic system 1000 can be used in conjunction with the subject disclosure.

These functions described above can be implemented in digital electronic circuitry; or in computer software, firmware or hardware. The techniques can be implemented using one or more computer program products. Programmable processors and computers can be included in or packaged as mobile devices. The processes and logic flows can be performed by one or more programmable processors or by one or more programmable logic circuitry. General and special purpose computing devices and storage devices can be interconnected through communication networks.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for simulating behavior of a quantum circuit comprising a plurality of single-qubit quantum gates and a plurality of two-qubit quantum gates, the method comprising:
receiving, by a computing device, information that represents the quantum circuit;
constructing an undirected graph corresponding to the quantum circuit, wherein a respective vertex within the undirected graph corresponds to a distinct variable in a Feynman path integral used for computing amplitude of the quantum circuit, and wherein a respective edge corresponds to one or more quantum gates;
identifying a vertex within the undirected graph that is coupled to at least two two-qubit quantum gates;
simplifying the undirected graph by removing the identified vertex, thereby removing the at least two two-qubit quantum gates coupled to the identified vertex; and
performing a simulation of the behavior of the quantum circuit, which comprises evaluating the simplified undirected graph;
wherein identifying the vertex comprised performing a greedy operation based on an objective function associated with a reduction of an execution time for evaluating the simplified undirected graph.

2. The computer-implemented method of claim 1, wherein identifying the vertex comprises traversing all vertices in the undirected graph.

3. The computer-implemented method of claim 1, further comprising computing an initial tensor-contraction ordering by performing a treewidth computing operation.

4. The computer-implemented method of claim 3, wherein performing the greedy operation comprises:
selecting a local range based on the initial tensor-contraction ordering; and
selecting an optimal vertex for removal within the local range in such a way that removing the optimal vertex results in a minimum time cost associated with evaluating the undirected graph.

5. The computer-implemented method of claim 1, wherein identifying the vertex comprises performing a dynamic programming operation.

6. The computer-implemented method of claim 1, wherein the two-qubit quantum gates comprise a two-qubit diagonal quantum gate.

7. The computer-implemented method of claim 6, wherein the two-qubit diagonal quantum gate comprises a controlled-Z (CZ) gate.

8. The computer-implemented method of claim 1, wherein the quantum circuit has at least 50 qubits and a depth of at least 30.

9. A computer system for simulating behavior of a quantum circuit comprising a plurality of single-qubit quantum gates and a plurality of two-qubit quantum gates, the system comprising:
a processor; and
a storage device coupled to the processor and storing instructions which when executed by the processor cause the processor to perform a method, wherein the method comprises:
receiving information that represents the quantum circuit;
constructing an undirected graph corresponding to the quantum circuit, wherein a respective vertex within the undirected graph corresponds to a distinct variable in a Feynman path integral used for computing amplitude of the quantum circuit, and wherein a respective edge corresponds to one or more quantum gates;
identifying a vertex within the undirected graph that is coupled to at least two two-qubit quantum gates;
simplifying the undirected graph by removing the identified vertex, thereby removing the at least two two-qubit quantum gates coupled to the identified vertex; and
performing a simulation of the behavior of the quantum circuit, which comprises evaluating the simplified undirected graph;
wherein identifying the vertex comprises performing a greedy operation based on an objective function associated with a reduction of an execution time for evaluating the simplified undirected graph.

10. The computer system of claim 9, wherein identifying the vertex comprises traversing all vertices in the undirected graph.

11. The computer system of claim 9, wherein the method further comprises computing an initial tensor-contraction ordering by performing a treewidth computing operation.

12. The computer system of claim 11, wherein performing the greedy operation comprises:
selecting a local range based on the initial tensor-contraction ordering; and
selecting an optimal vertex for removal within the local range in such a way that removing the optimal vertex results in a minimum time cost associated with evaluating the undirected graph.

13. The computer system of claim 9, wherein identifying the vertex comprises performing a dynamic programming operation.

14. The computer system of claim 9, wherein the two-qubit quantum gates comprise a two-qubit diagonal quantum gate, and wherein the two-qubit diagonal quantum gate comprises a controlled-Z (CZ) gate.

15. The computer system of claim 9, wherein the quantum circuit has at least 50 qubits and a depth of at least 30.

16. A non-transitory computer-readable storage medium storing instructions that when executed by a computer cause the computer to perform a method for simulating behavior of a quantum circuit comprising a plurality of single-qubit quantum gates and a plurality of two-qubit quantum gates, the method comprising:
receiving, by a computing device, information that represents the quantum circuit;
constructing an undirected graph corresponding to the quantum circuit, wherein a respective vertex within the undirected graph corresponds to a distinct variable in a Feynman path integral used for computing amplitude of the quantum circuit, and wherein a respective edge corresponds to one or more quantum gates;
identifying a vertex within the undirected graph that is coupled to at least two two-qubit quantum gates;
simplifying the undirected graph by removing the identified vertex, thereby removing the at least two two-qubit quantum gates coupled to the identified vertex; and
performing a simulation of the behavior of the quantum circuit, which comprises evaluating the simplified undirected graph;

wherein identifying the vertex comprises performing a greedy operation based on an objective function associated with a reduction of an execution time for evaluating the simplified undirected graph.

17. The non-transitory computer-readable storage medium of claim 16, wherein the method further comprises computing an initial tensor-contraction ordering by performing a treewidth computing operation, and wherein performing the greedy operation comprises:
   selecting a local range based on the initial tensor-contraction ordering; and
   selecting an optimal vertex for removal within the local range in such a way that removing the optimal vertex results in a minimum time cost associated with evaluating the undirected graph.

* * * * *